US008866533B2

(12) United States Patent
Lee

(10) Patent No.: US 8,866,533 B2
(45) Date of Patent: Oct. 21, 2014

(54) METHOD AND APPARATUS FOR CONTROLLING DEVICE IN ELECTRONIC EQUIPMENT

(75) Inventor: Woo Cheol Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/462,104

(22) Filed: May 2, 2012

(65) Prior Publication Data

US 2012/0286844 A1    Nov. 15, 2012

(30) Foreign Application Priority Data

May 13, 2011    (KR) .......................... 10-2011-0044938

(51) Int. Cl.
*H03K 17/00* (2006.01)
*H03K 19/00* (2006.01)

(52) U.S. Cl.
CPC .................................. *H03K 19/0016* (2013.01)
USPC ........... 327/365; 327/108; 327/427; 327/544; 327/376; 327/377

(58) Field of Classification Search
USPC ........................................................ 327/365
See application file for complete search history.

(56) References Cited

U.S. PATENT DOCUMENTS

| 4,803,481 | A | * | 2/1989 | Mueller et al. ................. 370/468 |
| 4,847,867 | A | * | 7/1989 | Nasu et al. ..................... 375/257 |
| 5,254,833 | A | * | 10/1993 | Okiyama .................. 219/121.68 |
| 5,740,199 | A | * | 4/1998 | Sibigtroth ...................... 375/219 |
| 5,952,850 | A | | 9/1999 | Hojo et al. |
| 6,549,060 | B1 | | 4/2003 | Mellinger et al. |
| 7,233,165 | B2 | * | 6/2007 | Jordy ............................... 326/29 |
| 7,276,939 | B2 | * | 10/2007 | Noto et al. ....................... 326/83 |
| 7,606,955 | B1 | * | 10/2009 | Falik et al. ..................... 710/110 |
| 2004/0070998 | A1 | * | 4/2004 | Deboes et al. ................. 363/28 |
| 2006/0202737 | A1 | * | 9/2006 | Walter ........................ 327/427 |
| 2008/0136389 | A1 | * | 6/2008 | Uchimoto et al. ............. 323/282 |
| 2008/0235523 | A1 | * | 9/2008 | Hussain ......................... 713/300 |
| 2010/0231268 | A1 | * | 9/2010 | Kumar et al. ................. 327/108 |

* cited by examiner

*Primary Examiner* — Lincoln Donovan
*Assistant Examiner* — Patrick Chen
(74) *Attorney, Agent, or Firm* — Jefferson IP Law, LLP

(57) ABSTRACT

A method and apparatus for controlling a device in electronic equipment having a plurality of devices are provided. The apparatus includes a power supply for supplying power, a slave device including a driving circuit operated according to the supplied power for transmitting and receiving data to and from another device, a switching circuit for connecting the driving circuit to a ground terminal when the switching circuit is turned-on and for opening the driving circuit from the ground terminal when the switching circuit is turned-off, and a host device for transmitting a control signal for turning-on the switching circuit when driving the slave device and for turning-off the switching circuit when not driving the slave device. When the device is not driven, the switching circuit may open a driving circuit from a ground terminal, thereby cutting-off leakage of an electric current through the device.

18 Claims, 5 Drawing Sheets

METHOD AND APPARATUS FOR CONTROLLING DEVICE IN ELECTRONIC EQUIPMENT

PRIORITY

This application claims the benefit under 35 U.S.C. §119(a) of a Korean patent application filed on May 13, 2011 in the Korean Intellectual Property Office and assigned Serial No. 10-2011-0044938, the entire disclosure of which is hereby incorporated by reference.

BACKGROUND OF THE INVENTION

1. Field of the Invention

The present invention relates to a method and an apparatus for operating electronic equipment. More particularly, the present invention relates to a method for controlling a device in electronic equipment having a plurality of devices and an apparatus thereof.

2. Description of the Related Art

In general, electronic equipment includes a plurality of devices. The devices of the electronic equipment are driven by power supplied from a power supply. The devices are selectively driven according to a mode executed in the electronic equipment. That is, the devices transmit and receive data. Here, each of the devices is implemented using an Integrated Circuit (IC) of a complicated construction. One or more of the devices may be implemented using an open drain scheme. That is, an output terminal of an IC in the one or more of the devices is open without any connection. Through this, upon the one or more of the devices being driven, a corresponding device may connect with a power supply through a pull-up unit. Further, when not being driven, a corresponding device may be in an idle state.

However, in the foregoing electronic equipment, power from the power supply may nevertheless be supplied to a device not being driven. That is, when a device is implemented in an open drain scheme, a voltage may inadvertently be applied to an output terminal of an IC in a device not being driven. Through this, the device not being driven may end up being turned-on despite being in an idle state. At this time, power from the power supply may be supplied to the device not being driven. In other words, an electric current may leak through the device not being driven in the electronic equipment.

SUMMARY OF THE INVENTION

Aspects of the present invention are to address at least the above-mentioned problems and/or disadvantages and to provide at least the advantages described below. Accordingly, an aspect of the present invention is to provide a method for controlling a device that cuts-off leakage of an electric current through a device not being driven in electronic equipment.

In accordance with an aspect of the present invention, an apparatus for controlling a device in electronic equipment including a plurality of devices is provided. The apparatus includes a power supply for supplying power, a slave device comprising a driving circuit operated according to the supplied power for transmitting and receiving data to and from another device, a switching circuit for connecting the driving circuit to a ground terminal when the switching circuit is turned-on and for opening the driving circuit from the ground terminal when the switching circuit is turned-off, and a host device for transmitting a control signal for turning-on the switching circuit when driving the slave device and for turning-off the switching circuit when not driving the slave device.

In accordance with another aspect of the present invention, a method for controlling a device in electronic equipment including a plurality of devices is provided. The method includes determining whether the device should be driven, based on an execution mode, and transmitting a control signal for turning-off a switching circuit disposed between a driving circuit for at least one of transmitting and receiving data with another device and a ground terminal such that the driving circuit is open with respect to the ground terminal when it is determined that the device should not to be driven.

In accordance with another aspect of the present invention, the method for controlling the device in electronic equipment including the plurality of devices further includes transmitting a control signal for turning-on the switching circuit such that the driving circuit is connected with the ground terminal when it is determined that the device should be driven, and at least one of transmitting and receiving the data the other device.

In a method and an apparatus for controlling a device in electronic equipment according to exemplary embodiments of the present invention, a switching circuit may be provided between a driving circuit and a ground terminal of the device, which cuts off leakage of an electric current through the device. That is, when the device is not driven, the switching circuit may open a driving circuit from a ground terminal, thereby cutting-off leakage of an electric current through the device. Through this, although a separate device such as a level shifter is not mounted between a power supply and each device in electronic equipment, the leakage of an electric current through the device may be cut-off. Accordingly, since a space for a level shifter in electronic equipment is not needed, miniaturization and thinning of the electronic equipment may be implemented. Furthermore, exemplary embodiments of the present invention may reduce a manufacturing cost of electronic equipment.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
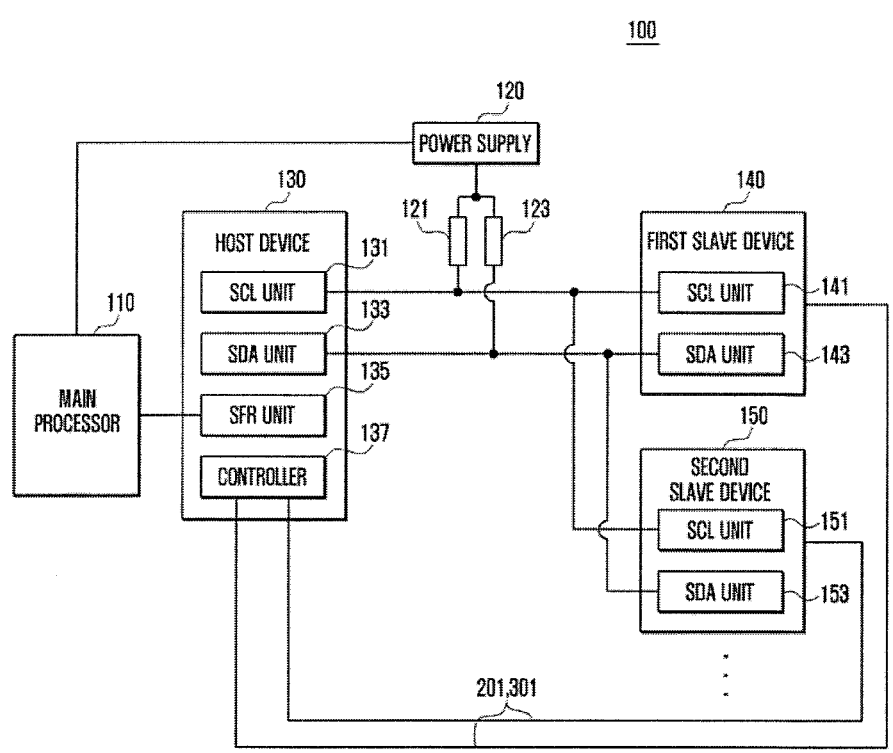
FIG. 1 is a block diagram illustrating a configuration of electronic equipment according to an exemplary embodiment of the present invention.
Figure 2:
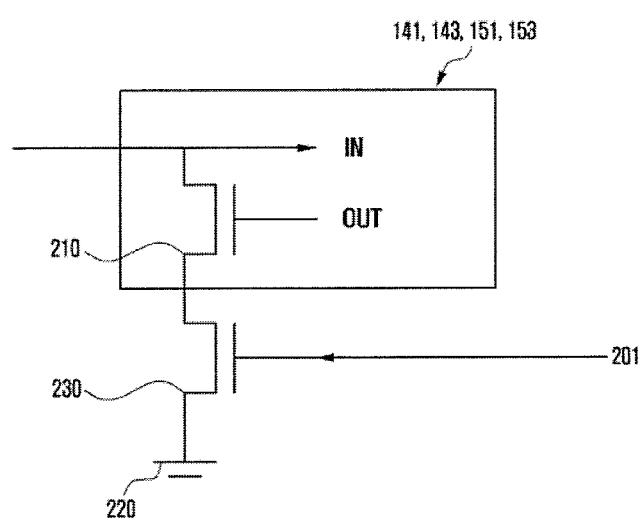
FIG. 2 is a circuitry diagram illustrating an example of a device shown in FIG. 1 according to an exemplary embodiment of the present invention.
Figure 3:
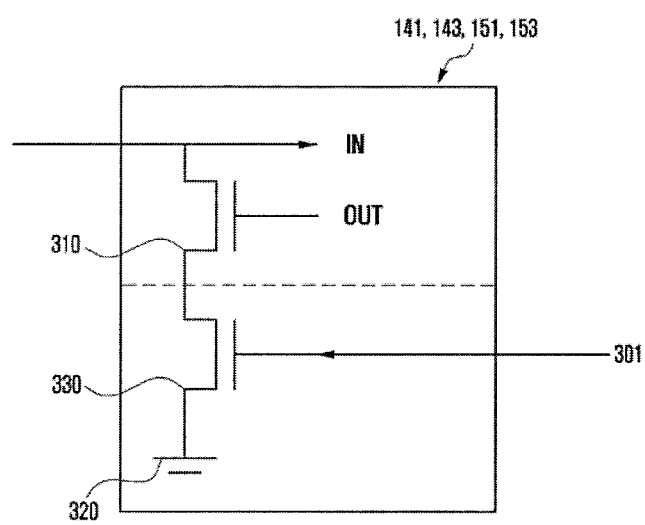
FIG. 3 is a circuitry diagram illustrating another example of a device shown in FIG. 1 according to an exemplary embodiment of the present invention.

FIG. 1 is a block diagram illustrating a configuration of electronic equipment according to an exemplary embodiment of the present invention. FIG. 2 is a circuitry diagram illustrating an example of a device shown in FIG. 1. FIG. 3 is a circuitry diagram illustrating another example of a device shown in FIG. 1.

Referring to FIG. 1, electronic equipment 100 of this exemplary embodiment includes a main processor 110, a power supply 120, and a plurality of devices 130, 140, and 150.

The main processor 110 controls an overall operation of the electronic equipment 100. The main processor 110 determines an execution mode of the electronic equipment 100. Further, the main processor 110 controls the devices 130, 140, and 150 according to the execution mode.

The power supply 120 supplies power in the electronic equipment. That is, the power supply 120 supplies power to the devices 130, 140, and 150. Further, the power supply 120 may include pull-up resistors 121 and 123.

The devices 130, 140, and 150 are selectively driven to execute a mode determined in the main processor 110. The devices 130, 140, and 150 may be implemented using a chip set. Each of the devices 130, 140, and 150 has a unique device address. Further, each of the devices 130, 140, and 150 is implemented using an Integrated Circuit (IC) of a complicated construction. Here, the devices 130, 140, and 150 may be implemented in an open drain scheme. In the devices 130, 140, and 150, an output terminal of the IC may be implemented using an open structure without any connection. Through this, upon driving the devices 130, 140, 150, they may connect with the power supply 120 through a pull-up unit. When the devices 130, 140, and 150 are not driven, they may be in an idle state. The devices 130, 140, and 150 may be connected through a communication link of an Inter IC (I2C) scheme. Here, up to 128 devices 130, 140, and 150 may be theoretically implemented using a plurality of chip sets on an interface of the same I2C scheme.

That is, one of the devices 130, 140, and 150 may act as a host device 130, and remaining devices thereof may act as slave devices 140 and 150. Here, the host device 130 is configured as a peripheral device of the main processor 110, which may be configured as the same chip package with the main processor 110. Meanwhile, the host device 130 controls the slave devices 140 and 150 through two signal lines corresponding to a Serial Clock Line (SCL) and a Serial Data line (SDA). In other words, the host device 130 may select at least one of the slave devices 140 and 150 according to the execution mode to exchange data. The respective slave devices 140 and 150 may connect with pull-up resistors 121 and 123 in the power supply 120. Here, the following is a description of respective constructions of the host device 130 and the slave devices 140 and 150.

The host device 130 includes an SCL unit 131, an SDA unit 133, a Special Function Register (SFR) unit 135, and a controller 137.

The SCL unit 131 generates a clock pulse for starting data transmission from the host device 130 to the slave devices 140 and 150, and then terminates data transmission. That is, the SCL unit 131 generates a high clock level to start data transmission, and generates a low clock level to terminate the data transmission.

The SDA unit 133 writes data in the slave devices 140 and 150, or reads data from the slave devices 140 and 150. At this time, the SDA unit 133 transmits a call signal to the slave devices 140 and 150. Here, the call signal includes device addresses of the slave devices 140 and 150, respectively. Further, when the slave devices 140 and 150 receive a response signal corresponding to the call signal, the SDA unit 133 may transmit data to the slave devices 140 and 150.

The SFR unit 135 acts as interface between the host device 130 and the main processor 110. At this time, the SFR unit 135 may receive a mode execution signal by which the man processor 110 instructs the host device to enter an execution mode. Here, the mode execution signal may contain a device address of the host device 130.

The controller 137 of the host device 130 generates and transmits a control signal for controlling the slave devices 140 and 150 to the slave devices 140 and 150. Here, the controller 137 may be set as a universal input/output port of the main processor 110. Meanwhile, the controller 137 analyzes the mode execution signal to determine whether it should enter the execution mode. Further, the controller 137 determines whether slave devices 140 and 150 should be driven based on the execution mode. Further, the controller 137 transmits drive control signals to the slave devices 140 and 150 in order to drive the slave devices 140 and 150. Here, in this exemplary embodiment, the drive control signals 201 and 301 may be determined according to a level of a signal. That is, when it is determined that the slave devices 140 and 150 should be driven, the controller 137 generates and transmits an active high, namely, a high signal level. Conversely, if it is determined that the slave devices 140 and 150 should not be driven, the controller 137 generates and transmits a low signal level. However, the present invention is not limited thereto. That is, the drive control signals 201 and 301 may be determined differently according to a chip set configuration of the host device 130 or the slave devices 140 and 150. That is, if it is determined that the slave devices 140 and 150 should be driven, the controller 137 may construct and transmit an active low, namely, a low signal level. Conversely, if it is determined that the slave devices 140 and 150 may not be driven, the controller 137 may construct and transmit a low signal level.

The slave devices 140 and 150 are driven according to drive control signals 201 and 301 of the host device 130, respectively. That is, if signal levels of the drive control signals 201 and 301 are high, the slave devices 140 and 150 are driven by the host device 130 to receive data. At this time, the slave devices 140 and 150 connect with the power supply in a pull-up unit. Conversely, if levels of the drive control signals 201 and 301 are low, the slave devices 140 and 150 may not be driven in an idle state. The slave devices 140 and 150 include SCL units 141 and 151, and SDA units 143 and 153, respectively.

The SCL units 141 and 151 detect the start and termination of data transmission of a host device 130 in the slave devices 140 and 150, respectively. That is, the SCL units 141 and 151 detect the start and termination of data transmission from a clock pulse of the host device 130. At this time, if the clock level is high, the SCL units 141 and 151 detect the start of the data transmission. Conversely, if the clock level is low, the SCL units 141 and 151 detect the termination of the data transmission.

The SDA units 143 and 153 receive data from the host device 130 or transmit data to the host device 130. At this time, when the host device 130 receives a call signal, the SDA units 143 and 153 analyze the call signal. That is, the SDA units 143 and 153 determine whether the call signal includes device addresses of the slave devices 140 and 150. If the call signal includes the device addresses of the slave devices 140 and 150, the SDA units 143 and 153 transmit a response signal corresponding to the call signal to the host device 130. Further, the SDA units 143 and 153 may receive data from the host device 130.

The SCL units 141 and 151 and the SDA units 143 and 153 include driving circuits 210 and 310 of an open drain scheme as shown in FIG. 2 and FIG. 3, respectively. At this time, the driving circuits 210 and 310 transmit data to the host device 130. The driving circuits 210 and 310 are implemented by opening an internal pull-up circuit forming a state in which an output terminal of an SCL or an SDA is without any connection. Each end of the driving circuits 210 and 310 may be implemented using a source terminal of a transistor. Further, switching lines 230 and 330 are provided between the driving circuits 210 and 310 and ground terminals 220 and 320. That is, the switching circuits 230 and 330 are disposed between each end of the driving circuits 210 and 310 and the ground terminals 220 and 320, respectively. At this time, the switching circuit 230 may be implemented independently from the driving circuit 210 as shown in FIG. 2 to be disposed outside of corresponding slave devices 140 and 150. Meanwhile, the switching circuit 330 may be integrally implemented with the driving circuits 210 and 310 as shown in FIG. 3 to be disposed inside the slave devices 140 and 150. The switching circuits 230 and 330 are turned on/off according to whether the corresponding slave devices 140 and 150 should be driven. In other words, the switching circuits 230 and 330 are turned-on/off according to drive control signals 201 and 301 of the host device 130.

That is, when the switching circuits 230 and 330 are implemented using an NPN type, the drive control signals 201 and 301 may have an active high. At this time, the switching circuits 230 and 330 may be turned-on according to drive control signals 201 and 301 corresponding to an active high. In other words, drive control signals 201 and 301 are applied to gate terminals of the switching circuits 230 and 330 to turn-on the switching circuits 230 and 330. In the meantime, when the switching circuits 230 and 330 are implemented by a PNP type, the drive control signals may have an active low. At this time, the switching circuits 230 and 330 may be turned-on according to drive control signals corresponding to an active low. When the switching circuits 230 and 330 are turned-on, they connect the driving circuits 210 and 310 to ground terminals 220 and 320. In other words, the switching circuits 230 and 330 provide a path of an electric current supplied from the power supply 120 through an external pull-up circuit of the driving circuits 210 and 310 of the slave devices 140 and 150. Through this, the slave devices 140 and 150 may independently control the driving circuits 210 and 310.

Meanwhile, when the switching circuits 230 and 330 are implemented using an NPN type, if signal levels of drive control signals 201 and 301 are low, the switching circuits 230 and 330 may be turned-off. In other words, low signal levels of the drive control signals 201 and 301 are applied to gate terminals of the switching circuits 230 and 330 to turn-off the switching circuits 230 and 330. In the meantime, when the switching circuits 230 and 330 are implemented using a PNP type, if the signal levels of the drive control signals 201 and 301 are high, the switching circuits 230 and 330 may be turned-off. In other words, high signal levels of the drive control signals 201 and 301 are applied to gate terminals of switching circuits 230 and 330 to turn-off the switching circuits 230 and 330. At this time, the switching circuits 230 and 330 open the driving circuits 210 and 310 from the ground terminals 220 and 320. Accordingly, a path to ground is open so that the driving circuits 210 and 310 are not operated. Through the foregoing procedures, when the slave devices 140 and 150 are not driven, a path of an electric current induced to driving circuits 210 and 310 of the SCL units 141 and 151 and the SDA units 143 and 153 through pull-up resistors 121 and 123 of the power supply 120 to be formed to ground terminals 220 and 320 is short-circuited. Through this, an electric current is prevented from being abnormally leaked through a driving circuit 210 or 310, namely, an open drain port is cut-off.

Figure 4:
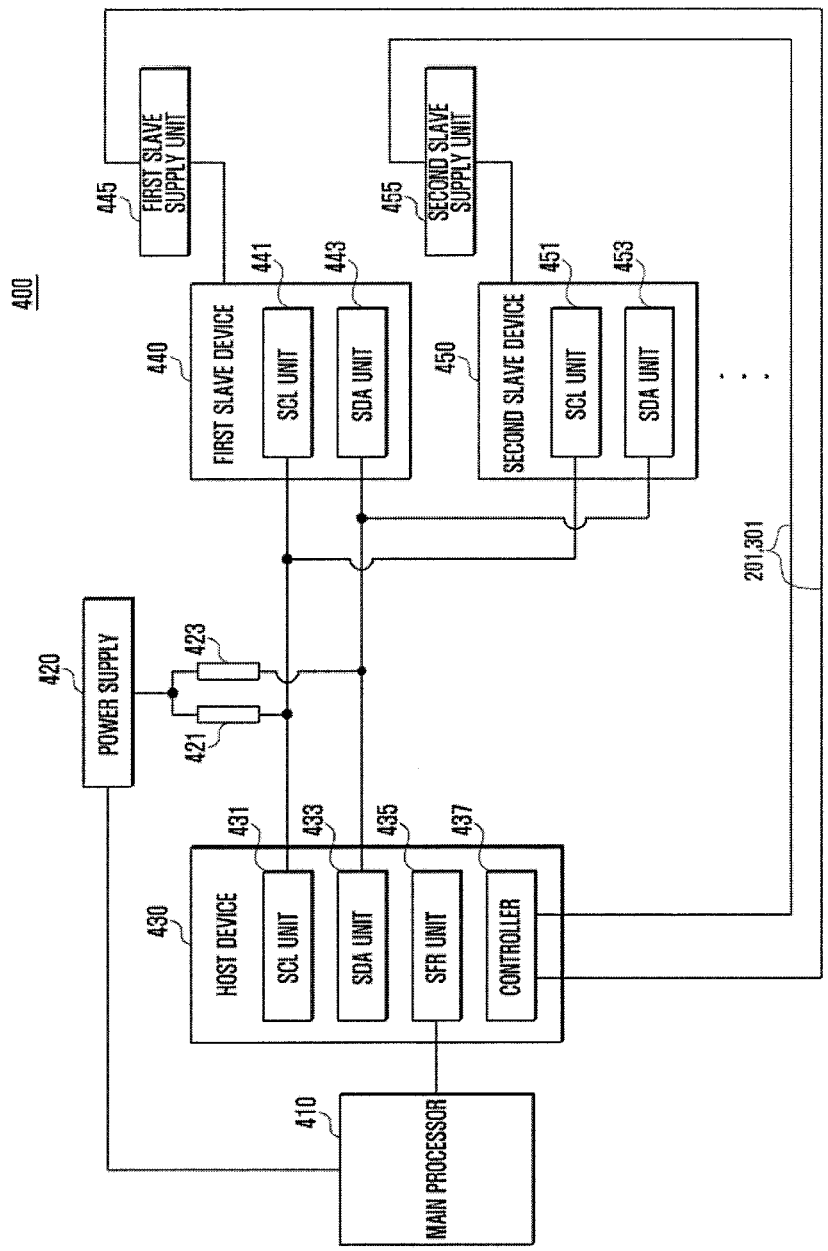
FIG. 4 is a block diagram illustrating a configuration of electronic equipment according to another exemplary embodiment of the present invention.

FIG. 4 is a block diagram illustrating a configuration of electronic equipment according to another exemplary embodiment of the present invention.

Referring to FIG. 4, an electronic equipment of this exemplary embodiment includes a main processor 410, a power supply 420, devices 430, 440, and 450, and slave supply units 445 and 455. In this case, the devices 430, 440, and 450 may be composed of a host device 430 and slave devices 440 and 450. Here, the host device 430 may be composed of peripheral devices of the main processor 410 as the same chip package with the main processor 410. Further, the host device 430 includes an SCL unit 431, an SDA unit 433, an SFR unit 435, and a controller 437. Here, the controller 437 may be set as universal input/output ports of the main processor 410. Meanwhile, the slave devices 440 and 450 include SCL units 441 and 451 and SDA units 443 and 453, respectively. At this time, the main processor 410, the power supply 420, and the devices 430, 440, and 450 of this exemplary embodiment have the same constructions as those of the foregoing exemplary embodiment, and thus a detailed description thereof is omitted for brevity.

However, in this exemplary embodiment, the slave supply units 445 and 455 supply sub power to slave devices 440 and 450 independently from the power supply 420. That is, the slave supply units 445 and 455 connect with slave devices 440 and 450 to supply sub power thereto, respectively. At this time, the slave supply units 445 and 455 may be turned-on/off according drive control signals 201 and 301 of the host device 430. That is, if the drive control signals 201 and 301 are an active high, the slave supply units 445 and 455 may be turned-on to perform an operation to supply sub power to the slave supply units 445 and 455. The slave supply units 445 and 455 may be turned-off so that sub power is not supplied to the slave devices 440 and 450. In the meantime, although it is not limited thereto, the drive control signals 201 and 301 may be determined differently according to a chip set construction of the host device 430 or slave devices 440 and 450. That is, if the drive control signals 201 and 301 are active low, the slave supply units 445 and 455 may be turned-on to perform an operation to supply sub power to the slave devices 440 and 450.

To do this, the controller 437 of the host device 430 may transmit drive control signals for controlling the slave supply units 445 and 455 according to whether the host device 430 should drive the slave devices 440 and 450. That is, if it is determined that the slave devices 440 and 450 should be driven, the controller 437 may transmit drive control signals 201 and 301 for turning-on the slave supply units 445 and 455 of the slave devices 440 and 450 to the slave supply units 445 and 455, respectively. In the meantime, it is determined that the slave devices 440 and 450 should not be driven, the controller 437 may transmit drive control signals 201 and 301 for turning-off the slave supply units 445 and 455 of the slave devices 440 and 450, respectively.

In addition, the switching units 230 and 330 are turned-on/off according to whether the slave devices 440 and 450 are driven, respectively. In other words, the switching circuits 230 and 330 are turned-on/off according to drive control signals 201 and 301 of the host device 430, respectively. At this time, the switching circuits 230 and 330 connect with the slave supply units 445 and 455 through gate terminals, respectively. Further, the switching circuits 230 and 330 are turned-on/off according to whether sub power from the slave supply units 445 and 455 is supplied to the gate terminals, respectively.

If the slave supply units 445 and 455 are turned-on according to the drive control signals 201 and 301, sub power from the slave supply units 445 and 455 are supplied to the slave devices 440 and 450, respectively. Further, if the sub power from the slave supply units 445 and 455 are supplied to gate terminals of the switching circuits 230 and 330, the switching circuits 230 and 330 are turned-on. At this time, the switching circuits 230 and 330 connect the driving circuits 210 and 310 to ground terminals 220 and 320, respectively. In other words, the switching circuits 230 and 330 provide a path of an electric current supplied from the power supply 420 through an external pull-up of the driving circuits 210 and 310 of the devices 440 and 450, respectively. Through this, the slave devices 440 and 450 may independently control the driving circuits 210 and 310, respectively.

In the meantime, if the slave supply units 445 and 455 are turned-off according to the drive control signals 201 and 301, sub power from the slave supply unit 445 and 455 is not supplied to the slave devices 440 and 450. Further, if the sub power from the slave supply units 445 and 455 are not applied to gate terminals of the switching circuits 230 and 330, respectively, the switching circuits 230 and 330 are turned-off. At this time, the switching circuits 230 and 330 open the driving circuits 210 and 310 from ground terminals 220 and 320, respectively. Accordingly, a path to ground is open in order to not operate the driving circuits 210 and 310. Through this, when the slave devices 440 and 450 are not driven, a path of an electric current induced to the driving circuits 210 and 310 of the SCL units 441 and 451 and the SDA units 443 and 453 and formed to the ground terminals 220 and 320 is short-circuited. Through this, an electric current is prevented from being abnormally leaked through a driving circuit 210 or 310, namely, an open drain port is cut-off.

Figure 5:
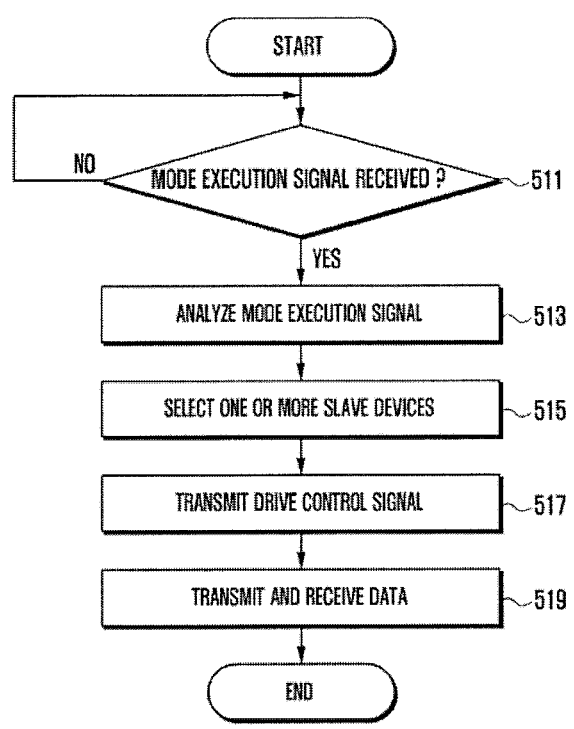
FIG. 5 is a flowchart illustrating a method for controlling a device according to an exemplary embodiment of the present invention.

FIG. 5 is a flowchart illustrating a method for controlling a device according to an exemplary embodiment of the present invention.

Referring to FIG. 5, in the method for controlling a device, a controller 137 or 437 of a host device 130 or 430 determines whether a mode execution signal instructing an execution mode of a main processor 110 or 410 is received in step 511. When the host device 130 or 430 is configured using peripheral devices of the main processor 110 or 410, there may not be a need for a procedure for receiving a mode execution signal from the main processor 110 or 410 by the controller 137 or 437 of the host device 130 or 430. In the meantime, the main processor 110 or 410 determines an execution mode of the electronic equipment. Further, the main processor 110 or 410 generate a mode execution signal instructing of the execution mode. Further, the main processor 110 or 410 transmit the mode execution signal to the host device 130 or 430. If the host device 130 or 430 is configured using peripheral devices of the main processor 110 or 410, there may be a need for a procedure for transmitting a mode execution signal to the host device 130 or 430. Here, the mode execution signal includes a device address of the host device 130 or 430.

Next, the controller 137 or 437 analyzes a mode execution signal in step 513. If the host device 130 or 430 is configured using peripheral devices of the main processor 110 or 410, there may not be a need for a procedure for analyzing a mode execution signal by the controller 137 or 437 of the host device 130 or 430. In the meantime, the controller 137 or 437 determines an execution mode from the mode execution signal. That is, the controller 137 or 437 may determine whether the mode execution signal includes a device address of the host device 130 or 430. Further, if the mode execution signal includes a device address of the host device 130 or 430, the controller 137 or 437 may recognize an execution mode from the mode execution signal.

Subsequently, the controller 137 or 437 of the host devices 130 or 430 selects one or more of the slave devices 140, 150, 440, and 450 according to the execution mode in step 515. That is, the controller 137 or 437 determines whether at least one of the slave devices 140, 150, 440, and 450 should be driven according to an execution mode. Further, the controller 137 or 437 selects the at least one of the slave devices 140, 150, 440, and 450 to be driven according to the execution mode. For example, when a first slave 140 or 440 of the slave devices 140, 150, 440, and 450 should be driven but remaining slave devices including a second slave device 150 or 450 should not be driven, the controller 137 or 437 selects the first slave device 140 or 440.

Subsequently, the controller 137 or 437 of the host devices 130 or 430 transmits a drive control signal 201 or 301 to the slave devices 140, 150, 440, 450 in step 517. At this time, upon driving the slave devices 140, 150, 440, 450, the SCL units 141, 151, 441, 451 and the SDA units 143, 153, 443, 453 connect with the power supply 120 or 420 through a pull-up unit. Further, when the slave devices 140, 150, 440, 450 are not driven, the slave devices 140, 150, 440, 450 may be in an idle state. Here, the controller 137 or 437 may turn-on/of a switching circuit 230 or 330 provided between the driving circuit 210 or 310 of the respective slave devices 140, 150, 440, 450 and a ground terminal 220 or 320 according to the drive control signal 201 or 301.

At this time, in an exemplary embodiment of the present invention, the controller 137 may transmit a drive control signal 201 or 301 to a switch circuit 230 or 330 provided between a driving circuit 210 or 310 of a slave device 140 or 150 and a ground terminal 220 and 320. If a universal input/output port of the main processor 100 is used, a drive control signal 201 or 301 of the controller 137 may be generated by the main processor 110. Here, the driving control signals 201 and 301 may be determined according a signal level. That is, if it is determined that the slave device 140 or 150 should be driven, the controller 137 may generate and transmit the drive control signal 201 or 301 of an active high, namely, a high signal level of the drive control signal 201 or 301. Conversely, if it is determined that the slave device 140 or 150 may be not driven, the controller 137 may generate and transmit a low signal level. Meanwhile, although it is not limited, the drive control signals 201 and 301 may be determined differently according to a chip set configuration of the host device 130 or the slave devices 140 and 150. That is, it is determined that the slave devices 140 and 150 should be driven, the controller 137 may generate and transmit an active low, namely the drive control signal 201 or 301 of a low signal level. Conversely, it is determined that the slave devices 140 and 150 may not be driven, the controller 137 may construct and transmit a high signal level.

For example, the controller 137 generates and transmits a high signal level to a switching circuit 230 or 330 of the first slave device 140 in the slave devices 140 and 150. Further, if a signal level of the drive control signal 201 or 301 is high, a switching circuit 230 or 330 of the first slave device 140 is turned-on. At this time, the switching circuit 230 or 330 connects a driving circuit 210 or 310 of the first slave device 140 to a ground terminal 220 or 320. Through this, the driving circuit 201 or 310 of the first salve device 140 is operated. Through this, the first slave device 140 may normally exchange data with the host device 130.

In the meantime, the controller 137 generates and transmits a low signal level to remaining slave devices including a second slave device 150 of the slave devices 140 and 150. Further, if a signal level of the drive control signal 201 or 301 is low, a switching circuit 230 or 330 of the second slave device 150 is turned-off. At this time, the switching circuit 230 or 330 opens the driving circuit 210 or 310 of the second slave device 150 from the ground terminal 220 or 230. That is, when the second slave device 150 is not driven, a path of an electric current introduced to driving circuits 210 and 310 of the SCL unit 151 and the SDA unit 153 through pull-up resistors 121 and 123 of the power supply 120 and formed to the ground terminals 220 and 320 is short-circuited. Through this, an electric current is prevented from being abnormally leaked through a driving circuit 210 or 310, namely, an open drain port.

Meanwhile, the controller 437 may transmit drive control signals 201 and 301 to slave supply units 445 and 455 corresponding to slave devices 440 and 450 according to another exemplary embodiment of the present invention, respectively. Here, the drive control signals 201 and 301 may control on/off of the slave supply units 445 and 455, respectively. That is, it is determined that the slave device 440 or 450 should be driven, the controller 437 turns-on the slave supply unit 445 or 455 according to the drive control signal 201 or 301. Conversely, it is determined that the slave device 440 or 450 should not be driven, the controller 437 turns-off the slave supply unit 445 or 455 according to the drive control signal 201 or 301.

For example, the controller 437 turns-on a first slave supply unit 445 of the slave supply units 445 and 450 for the first slave device 440 according to the drive control signals 201 and 301. If the first slave supply unit 445 is turned-on according to the drive control signals 201 and 301, sub power from the first slave supply unit 445 is supplied to the first salve device 440. Further, if supply of sub power from the first slave supply unit 445 is detected, the switching circuit 230 and 330 of the first slave device 440 are turned-on. At this time, the switching circuits 230 and 330 connect the driving circuits 210 and 310 of the first slave device 440 to the ground terminals 220 and 320, respectively. That is, the switching circuits 230 and 330 provide a path of an electric current supplied from the power supply 420 through an external pull-up unit of driving circuits 210 and 310 of the first slave device 440, respectively. This may control the driving circuits 210 and 310 of the first slave devices 440, respectively.

Meanwhile, the controller 437 turns-off the second slave supply unit 455 for the second slave device 450 of the slave supply units 445 and 455 according to the drive control signals 201 and 301. Further, if the second slave supply unit 455 is turned-off according to the drive control signals 201 and 301, sub power from the second slave supply unit 455 is not supplied to the second slave device 450. Further, if sub power from the second slave supply unit 455 is not applied to gate terminals of the switching circuits 230 and 330, the switching circuits 230 and 330 of the second slave device 450 are turned-off. At this time, the switching circuits 230 and 330 open the driving circuits 210 and 310 of the second slave device 450 from the ground terminals 220 and 320, respectively. That is, a path to ground is turned-off in order to not operate the driving circuits 210 and 310. Through this, when the second device 450 is not operated, a path of an electric current induced to the driving circuits 210 and 310 of the SCL unit 451 and the SDA unit 453 through pull-up resistors 421 and 423 of the power supply 420 and formed to the ground terminals 220 and 320 is short-circuited. Through this, an electric current is prevented from being abnormally leaked through driving circuit 210 or 310, namely, an open drain port.

Finally, a controller 137 or 437 of a host device 130 or 430 transmits and receives data to and from a part of slave devices 140, 150, 440, and 450 in step 519. For example, the controllers 137 and 437 exchange data with a first slave device 140 and 440 of the slave devices 140, 150, 440, and 450, respectively.

Meanwhile, the foregoing exemplary embodiments have illustrated that switching circuits are provided between driving circuits of an SCL unit and an SDA unit and ground terminals in each of devices, respectively. The present invention is not limited thereto. That is, in each of the devices, an SCL unit and an SDA unit may share one switching circuit to implement the exemplary embodiments of the present invention. In other words, in each device, one switching circuit may be provided between driving circuits of an SCL unit and an SDA unit and a ground terminal. At this time, when turning-on the switching circuit, driving circuits of an SCL unit and an SDA unit may connect with a ground terminal. Conversely, when turning-off the switching circuit, in each device, driving circuits of the SCL unit and the SDA unit may be open from the ground terminal.

In exemplary embodiments of the present invention, a switching circuit may be provided between a driving circuit of a device and a ground terminal in electronic equipment to cut-off leakage of an electric current flowing through the device. That is, when the device is not driven, the switching circuit may open the driving circuit from the ground terminal to cut-off leakage of an electric current flowing through the device. Through this, although a separate device such as a level shifter is not mounted between a power supply and each of devices in the electronic equipment, leakage of an electric current flowing through the devices may be cut-off Therefore, since there is not a need for a space for the level shifter in the electronic equipment, miniaturization and thinning of the electronic equipment may be implemented. In addition, a manufacturing cost of the electronic equipment may be reduced.

While the invention has been shown and described with reference to certain exemplary embodiments thereof, it will be understood by those skilled in the art that various changes in form and details may be made therein without departing from the spirit and scope of the invention as defined by the appended claims and their equivalents

What is claimed is:

1. An apparatus for controlling a device in electronic equipment including a plurality of devices, the apparatus comprising:
   a power supply configured to supply power;
   a slave device comprising a driving circuit configured to drive the power supplied from the power supply to the slave device;
   a switching circuit configured to connect the driving circuit to a ground terminal when the switching circuit is turned-on and to disconnect the driving circuit from the ground terminal when the switching circuit is turned-off;
   a host device configured to transmit a control signal for turning-on the switching circuit when driving the power to the slave device and to turn-off the switching circuit when not driving the power to the slave device, and
   a slave supply unit connected with the slave device configured to supply a sub power to the slave device according to the control signal,
   wherein the control signal turns-on the slave supply unit to supply the sub bower or turns-off the slave suly unit to not suly the sub power.

2. The apparatus of claim 1, wherein the control signal is determined according to a signal level.

3. The apparatus of claim 2, wherein the switching circuit is turned-on when the signal level is high and the switching circuit is turned-off when the signal level is low.

4. The apparatus of claim 2, wherein the switching circuit is turned-off when the signal level is high and the switching circuit is turned-on when the signal level is low.

5. The apparatus of claim 2, wherein the control signal is input to a gate terminal of the switching circuit.

6. The apparatus of claim 1, wherein the driving circuit is implemented using an open drain port.

7. The apparatus of claim 1, wherein
   the switching circuit is turned-on when the slave supply unit is turned-on and the switching circuit is turned-off when the slave supply unit is turned-off.

8. The apparatus of claim 7, wherein the switching circuit is connected with the slave supply unit through a gate terminal, and the switching circuit is turned-on when the sub power of the slave supply unit is supplied to the gate terminal and the switching circuit is turned-off when the sub power of the salve supply unit is not supplied to the gate terminal.

9. The apparatus of claim 1, wherein the driving circuit is integrally formed with the switching circuit.

10. A method for controlling a device in electronic equipment including a plurality of devices, the method comprising:
    determining whether the device should be driven, based on an execution mode; and
    transmitting a control signal for turning-off a switching circuit disposed between a driving circuit configured to drive a power supplied from a power supply to the device and a ground terminal such that the driving circuit is disconnected with respect to the ground terminal when it is determined that the device should not be driven,
    wherein a slave device is connected with a slave supply unit configured to supply sub power to the slave device according to the control signal, and
    wherein the control signal turns-on the slave supply unit to supply the sub power or turns-off the slave supply so as to not supply the sub power.

11. The method of claim 10, further comprising:
    transmitting the control signal for turning-on the switching circuit such that the driving circuit is connected with the ground terminal when it is determined that the device should be driven; and
    at least one of a transmitting of and a receiving of data to or from another device.

12. The method of claim 11, wherein the control signal is determined according to a signal level, and the switching circuit is turned-on when the signal level is high and the switching circuit is turned-off when the signal level is low.

13. The method of claim 11, wherein the control signal is determined according to a signal level, and the switching circuit is turned-off when the signal level is high and the switching circuit is turned-on when the signal level is low.

14. The method of claim 11, wherein the control signal is input to a gate terminal of the switching circuit.

15. The method of claim 10, wherein the driving circuit is implemented using an open drain port.

16. The method of claim 10, wherein
    the switching circuit is turned-on when the slave supply unit is turned-on and the switching circuit is turned-off when the slave supply unit is turned-off.

17. The method of claim 16, wherein the switching circuit is connected with the slave supply unit through a gate terminal, and the switching circuit is turned-on when the sub power of the slave supply unit is supplied to the gate terminal and the switching circuit is turned-off when the sub power of the salve supply unit is not supplied to the gate terminal.

18. The method of claim 10, wherein the driving circuit is integrally formed with the switching circuit.

* * * * *